(12) United States Patent
Sanielevici et al.

(10) Patent No.: US 7,701,271 B1
(45) Date of Patent: Apr. 20, 2010

(54) HIGH LINEARITY CHARGE PUMP METHOD AND APPARATUS

(75) Inventors: Sergio Sanielevici, Redwood City, CA (US); Katelijn Vleugels, San Carlos, CA (US)

(73) Assignee: Ozmo, Inc., Palo Alto, CA (US)

( * ) Notice: Subject to any disclaimer, the term of this patent is extended or adjusted under 35 U.S.C. 154(b) by 0 days.

(21) Appl. No.: 12/237,355

(22) Filed: Sep. 24, 2008

Related U.S. Application Data

(60) Provisional application No. 60/974,784, filed on Sep. 24, 2007.

(51) Int. Cl.
*H03L 7/06* (2006.01)
(52) U.S. Cl. ........................................ 327/157; 327/536
(58) Field of Classification Search .................. None
See application file for complete search history.

(56) References Cited

U.S. PATENT DOCUMENTS

| | | | |
|---|---|---|---|
| 5,166,641 A | 11/1992 | Davis et al. | |
| 5,508,660 A | 4/1996 | Gersbach et al. | |
| 5,760,640 A | 6/1998 | Girard et al. | |
| 6,107,889 A | 8/2000 | Strange et al. | |
| 6,229,362 B1 | 5/2001 | Choi | |
| 6,329,872 B1 | 12/2001 | Foroudi | |
| 7,009,432 B2 | 3/2006 | Beghein | |
| 7,427,900 B2 | 9/2008 | Manetakis et al. | |
| 7,570,105 B1 * | 8/2009 | Baek et al. | 327/536 |
| 2003/0038669 A1 * | 2/2003 | Zhang | 327/536 |
| 2005/0127984 A1 * | 6/2005 | Ohtaka | 327/536 |
| 2006/0055451 A1 * | 3/2006 | Gu | 327/536 |

* cited by examiner

*Primary Examiner*—Cassandra Cox
(74) *Attorney, Agent, or Firm*—Philip H. Albert; Townsend and Townsend and Crew, LLP

(57) ABSTRACT

A charge pump configured for use in a phase-locked loop includes positive and negative current sources, transistor switches, voltage nodes and one or more operational amplifiers, wherein the positive and negative current sources each includes an output node, the output nodes are respectively connected sequentially to the voltage nodes having substantially the same voltage, the transistor switches are configured to sequentially switch such that at all times there is one transistor switch connection, and the currents flows through the transistor switches into one of the voltage nodes. One of the voltage nodes is connected to the PLL filter and the transistor switches are connected to the PLL filter and are controlled by the phase error pulses. Two voltage nodes are possible. The second node provides feedback. The currents to the second node are supplied substantially simultaneously for the same amount of time.

14 Claims, 5 Drawing Sheets

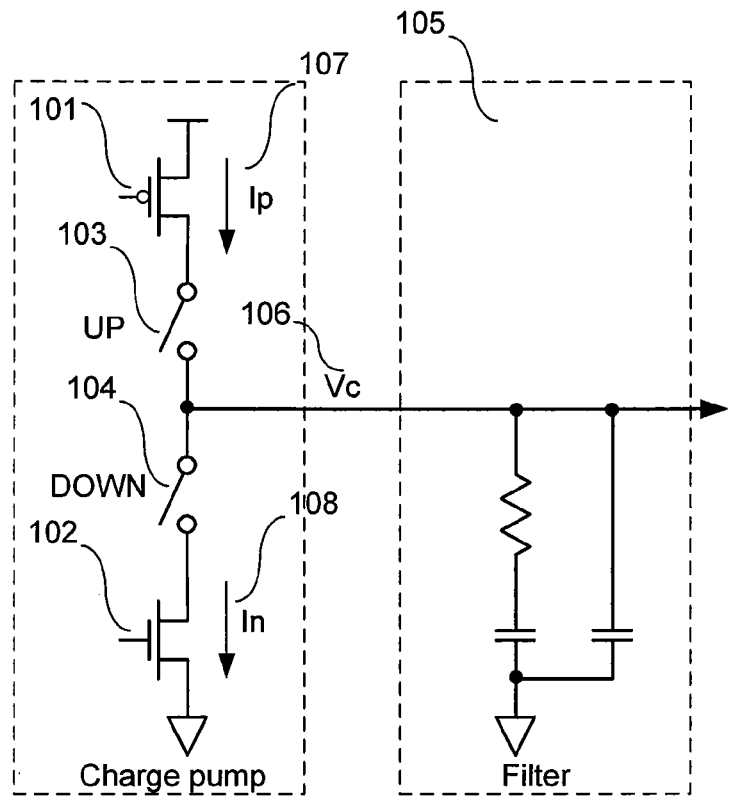
PRIOR ART    FIG. 1
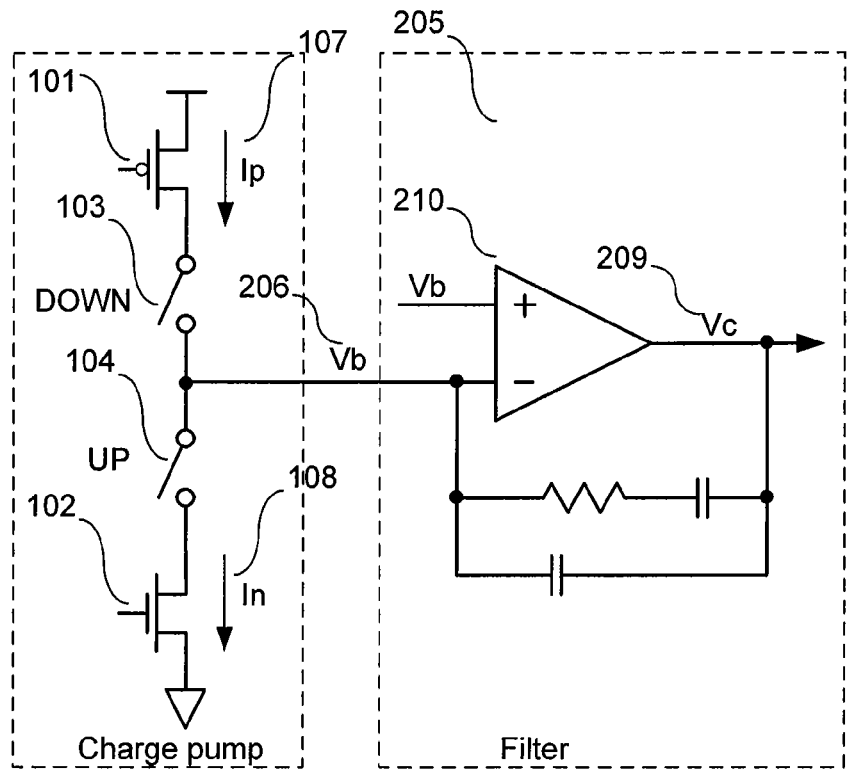
PRIOR ART    FIG. 2

HIGH LINEARITY CHARGE PUMP METHOD AND APPARATUS

PRIORITY INFORMATION

This application claims benefit under 35 USC §119(e) of U.S. Provisional Patent Application No. 60/974,784 filed Sep. 24, 2007, which is herein incorporated by reference in its entirety for all purpose.

FIELD OF THE INVENTION

The present invention relates generally to phase-locked loops (PLLs) and more particularly relates to a charge-pump configured for use with a phase detector and a loop filter as integral components of the PLL.

BACKGROUND OF THE INVENTION

A phase-locked loop ("PLL") can generally be described as an electronic device or circuit that, when presented with an input signal having frequency-domain spectral components of sufficiently stable frequency and phase, generates an output signal of relatively good spectral purity having a frequency and phase substantially correlated to the frequency and phase of the dominant spectral component of the input signal.

PLLs have many forms of implementation, function of intended use, and application. PLLs can have analog loops or digital loops. PLLs might be used for communication systems, for example to keep a receiver in phase lock with a received signal. For communication systems, a particular application of PLLs is for clock recovery circuits and frequency synthesizers.

Frequency synthesizers sometimes present problems. In a frequency synthesizer, the input signal is referred to as a reference clock. The reference clock is a repetitive digital signal having a substantially fixed frequency and relatively high spectral purity (most often a square-wave). The output signal (or signals) is generated in a voltage controlled oscillator ("VCO"). This output signal is frequency related to the reference clock frequency by a known ratio. In some applications the frequency is fixed, whereas in other applications, the frequency is programmable.

In a typical frequency synthesizer, a digital phase detector compares the phase of a reference clock signal to the phase of a signal derived from a VCO, such as a counter that counts the oscillations of the signal output by the VCO. The phase detector sends a digital signal to a charge pump and an analog output of the charge pump is filtered by a filter and used to generate a VCO control voltage. In this basic form, the VCO frequency is N times the reference clock frequency when the PLL is locked, where N is the counter's division ratio. The PLL can include a delta-sigma modulator to form a delta-sigma driven frequency synthesizer.

The ratio N may be varied in time in a random or pseudo-random sequence, with the result that the ratio of the VCO frequency to the reference clock frequency can be a non-integer number, but is the time average of N. Changing the counter ratio N produces a random or sequence to be output from the digital phase detector and from the charge pump's analog output.

Nonlinearities in the phase detector/charge pump combination are often an issue, as they could cause the high frequency components of the random phase sequence to intermix and generate low frequency components in the output of the charge pump.

Some common implementations of phase-frequency detectors exhibit relatively high nonlinearity, usually due to the charge pump and in low power supply voltage designs.

FIG. 1 illustrates a typical known implementation of a charge pump. In this example, the charge pump is configured for use with a VCO that has a positive gain, i.e., the frequency increases with increased control voltage. However, negative gain VCOs would use similar principles. FIG. 1 shows a filter 105 configured to receive positive or negative charges every reference clock cycle via currents Ip 107 and In 108, which are switched in by switches UP 103 and DOWN 104.

The currents Ip and In are typically generated by current sources implemented with transistors. A simple common configuration for CMOS devices is a PMOS transistor 101 generating the positive current and a NMOS transistor 102 generating the negative current. A positive charge injected into the filter causes the voltage VC 106 to increase and a negative charge injected into the filter causes the voltage VC 106 to decrease.

The phase detector (not shown) driving this charge pump generates an UP pulse if the reference clock phase is leading the oscillator phase and a DOWN pulse if the reference clock phase is lagging the oscillator phase. The pulse width is proportional to the phase difference. Thus, the positive charge injected is the product of the pulse width of the UP pulse and the current Ip, whereas the negative charge is the product of the pulse width of the DOWN pulse and the current In. Extra charge is injected every time one of the switches opens or closes, due to the capacitances present in the devices used for the switches and current sources.

There are two primary causes of non-linearity. The first cause of non-linearity is due to the currents Ip and In not being equal. In low voltage designs, the typical implementation for current sources is the one shown in FIG. 1 with just one transistor used per current source. The accuracy of the currents is limited by device matching and output resistance. Due to the finite output resistance of the transistors, variations in the voltage Vc will change the ratio of the two currents.

The second cause of non-linearity is the variation of the switching charges with the pulse width. This can happen if the phase difference switching is added or removed and/or if two switching events become close together in time such that the voltages involved in generating the charge do not have time to settle. Some of these issues are also related to the use of the phase detector.

An active filter can be used instead of a passive filter, as shown in FIG. 2. That figure shows the charge pump of FIG. 1, but with an active filter 205 that provides the filter output Vc (209). In this example, the output voltage (206) of the charge pump is fixed at Vb (as provided by the operational amplifier input 210) and the output resistance limitation is removed due to currents matching. The disadvantages are that this requires an operational amplifier, with its additional complexity and noise, and the use of floating filter capacitors.

There are many known charge pumps configured to address some of these issues, such as those shown in U.S. Pat. Nos. 5,166,641; 5,508,660; 5,760,640; 6,107,889; 6,229,362; 6,329,872; 7,009,432 and 7,427,900. U.S. Pat. No. 7,427,900 describes the use of a charge pump replica to control the output current variation with the output voltage. This has the disadvantage of transistor matching errors between the charge pump and its replica. U.S. Pat. No. 5,166,641 describes the use of separate calibration cycles to achieve current matching.

There is a need for improvements over the prior art.

BRIEF SUMMARY OF THE INVENTION

Other objects, features, advantages, and benefits of the present invention will become apparent upon consideration of the following detailed description and the graphs.

BRIEF DESCRIPTION OF THE DRAWINGS

FIG. 1 is a schematic diagram of a previously known charge pump with a passive filter as might be used in a phase-locked loop circuit.

FIG. 2 is a schematic diagram of a previously known charge pump with an active filter as might be used in a phase-locked loop circuit.

DETAILED DESCRIPTION OF THE INVENTION

The present disclosure describes improved methods and apparatus for constructing, using and operating a phase-locked loop ("PLL") and charge pump therefore. While useful in many application, it has advantages in low-power and high-speed PLLs. What follows is example embodiments and upon reading this disclosure, one or ordinary skill in the art should be able to make and use these examples and other variations of these examples without undue experimentation.

A PLL can generally be described as an electronic device which, when presented with an input signal having frequency-domain spectral components of sufficiently stable frequency and phase, generates an output signal of relatively good spectral purity having a frequency and phase substantially correlated to the frequency and phase of the dominant spectral component of the input signal.

Embodiments of the present invention are more specifically related to digital PLLs configured for use in communication systems. PLLs have many forms of implementation, function of intended use, and application. For communication systems, a particular application of PLLs is for clock recovery circuits and frequency synthesizers.

More specifically yet, some embodiments of the present invention address some particular issues present in the design of frequency synthesizers. In a frequency synthesizer, the input signal is referred to as a reference clock. The reference clock is a repetitive digital signal having a substantially fixed frequency and relatively high spectral purity (most often a square-wave). The output signal (or signals) is generated in a voltage controlled oscillator (VCO). This output signal is frequency related to the reference clock frequency by a known ratio, in some applications the frequency is fixed whereas in other applications the frequency is programmable.

Figure 3:
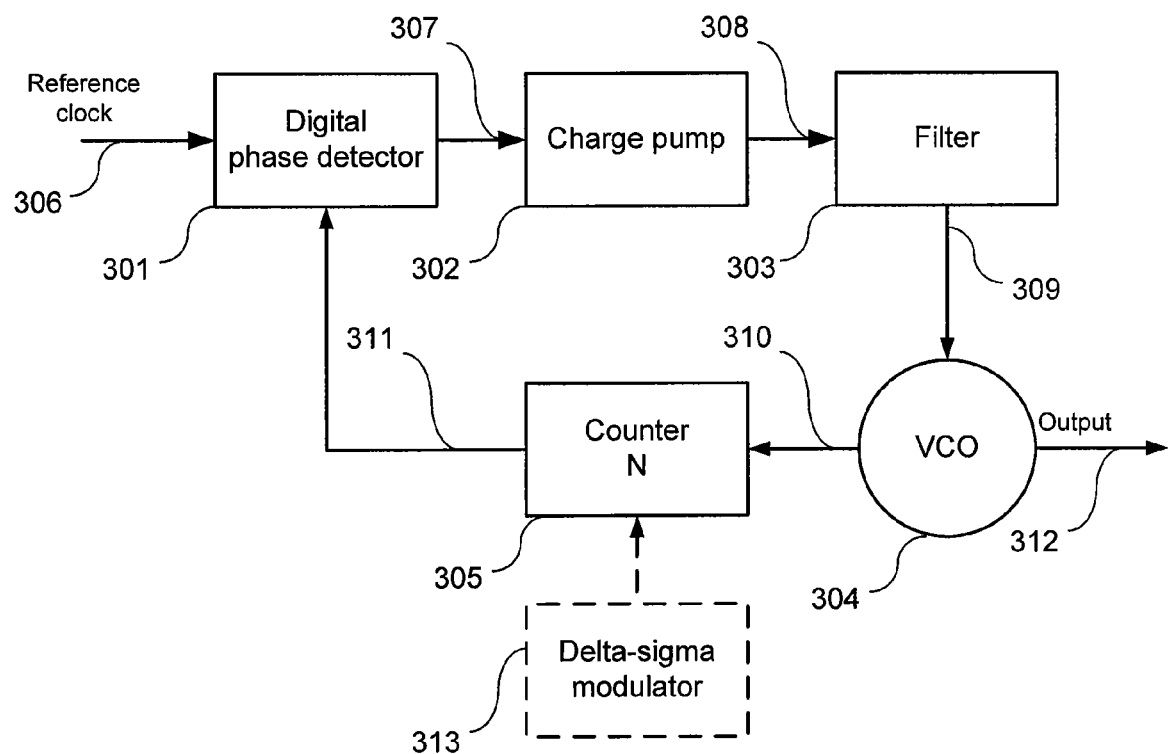
FIG. 3 is a block diagram of a phase-locked loop circuit ("PLL") that includes a charge pump, filter and other elements; as shown, the circuit could use previously known elements to form a previously known phase-locked loop circuit or could use novel elements described herein to form an embodiment of a phase-locked loop or element according to the present invention.

FIG. 3 is a simplified schematic of a typical frequency synthesizer. The frequency synthesizer includes a digital phase detector 301 that is configured to compare the phase of a reference clock signal 306 to the phase of a signal 311. Signal 311 is derived from a signal 310 generated by a VCO 304. More specifically, signal 311 is generated by a counter 305 that is configured to count the oscillations of the signal output by the VCO.

Phase detector 301 is configured to generate a digital output 307, which is configured to drive a charge pump 302. An analog output 308 of charge pump 302 is filtered by a filter 303, which is configured to generate a VCO control voltage 309. In this basic form, the VCO frequency is N times the reference clock frequency when the PLL is locked. According to a specific embodiment, the PLL includes a delta-sigma modulator 313 that may be included in the PLL for specific application of the PLL, such as for a delta-sigma driven frequency synthesizer.

In the embodiment of the PLL shown in FIG. 3, the counter division ratio N may be varied in time in a random sequence, with the result that the ratio of the VCO frequency to the reference clock frequency can be a non-integer number, which is the time average of N. Changing the counter ratio N produces a random sequence to be output from the digital phase detector and from the charge pump's analog output.

According to one embodiment of the present invention, delta-sigma modulator 313 is configured to generate a random sequence of numbers which has a defined spectrum. The spectral density is relatively low at low frequency and increases at high frequencies such that most of the power is placed outside the PLL bandwidth. The filter 303, which is a low pass filter, is configured to attenuate the high frequencies produced in the output of the charge pump as a result of the delta-sigma modulator action and thus the control voltage of the VCO and will have relatively low noise.

In order for the relatively low noise to be achieved, the phase detector/charge pump combination should be substantially linear. Nonlinearities would cause the high frequency components of the random phase sequence present in the signal 311 to intermix and generate low frequency components in the output of the charge pump.

Novel charge pump circuits and methods of operation are described herein that may address some of these short-comings.

Figure 4:
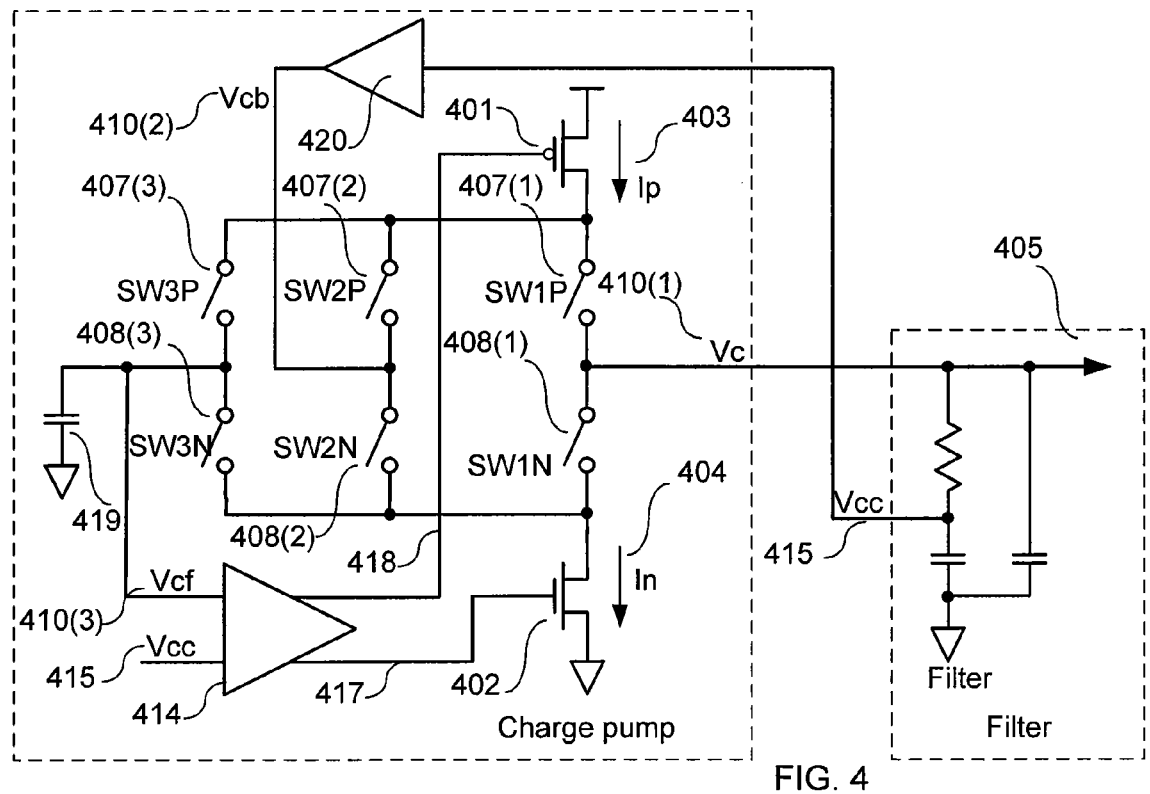
FIG. 4 is a schematic diagram of a novel charge pump according to embodiments of the present invention, followed by a passive filter.

Referring to FIG. 4, the charge pump circuit includes a positive current source 401 (e.g., a PMOS transistor) that is connected to switches 407(1), 407(2) and 407(3), which may be any of a variety of transistors, such as PMOS and/or NMOS transistors. Switches 407(1)-(3) are configured to be closed and opened, respectively, via control signals SW1P, SW2P, and SW3P. A negative current source 402 is connected to switches 408(1), 408(2) and 408(3), which may be any of a variety of transistors, such as PMOS and/or NMOS transistors. Switches 408(1)-(3) are configured to be closed and opened, respectively, via control signals SW1N, SW2N, and SW3N. A common node 406 of the switches 407(1) and 408(1) may be coupled to a filter 405 according to a specific embodiment of the present invention.

A common node 413 of switches 407(2) and 408(2) may be connected to the output node of a unity gain buffer 420. An input of unity gain buffer 420 may be connected to filter 405 at node 415 according to a particular embodiment of the present invention. According to an alternate embodiment, filter 405 may be coupled to node 406.

The low frequency component of the voltage Vcc of the node 415 is the same as that of node 406. One purpose of unity gain buffer 420 is to replicate this voltage to the node 413 so that the voltage Vcb is substantially the same as Vcc regardless of whether current flows into node 413.

A common node 416 of switches 407(3) and 408(3) is connected to a capacitor 419 and one of the inputs of an operational amplifier 414. The other input of operational amplifier 414 is connected to a node 415. The outputs of the operational amplifier 414 (nodes 417 and 418) are connected respectively to the current control nodes of the current sources 402 and 401 such that if the voltage Vcf on node 416 increases relative to the voltage Vcc on the node 415, the current In 404 increases relative to the current Ip 403. Due to this feedback mechanism, in normal operation, the voltage Vcf on node 416 becomes substantially equal to the voltage Vcc on node 415.

Figure 5:
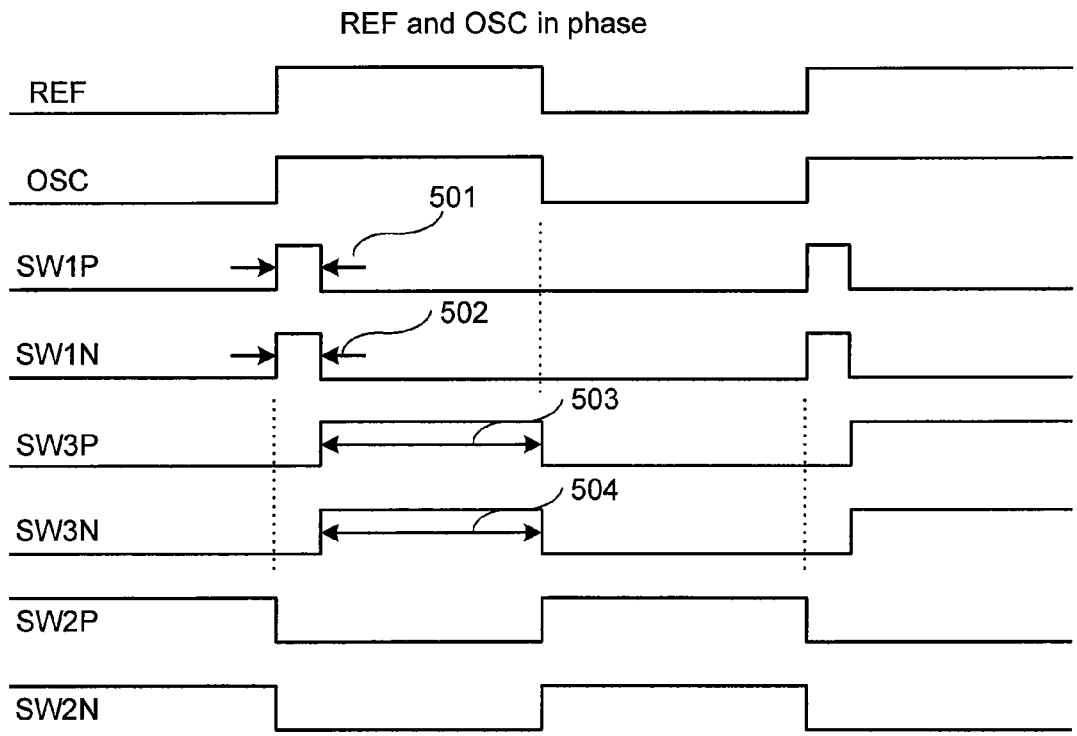
FIG. 5 is a timing diagram as might be present at various nodes of the circuits of FIG. 4 or 8 in the PLL of FIG. 3, where the reference clock and the oscillator clock are in phase.
Figure 6:
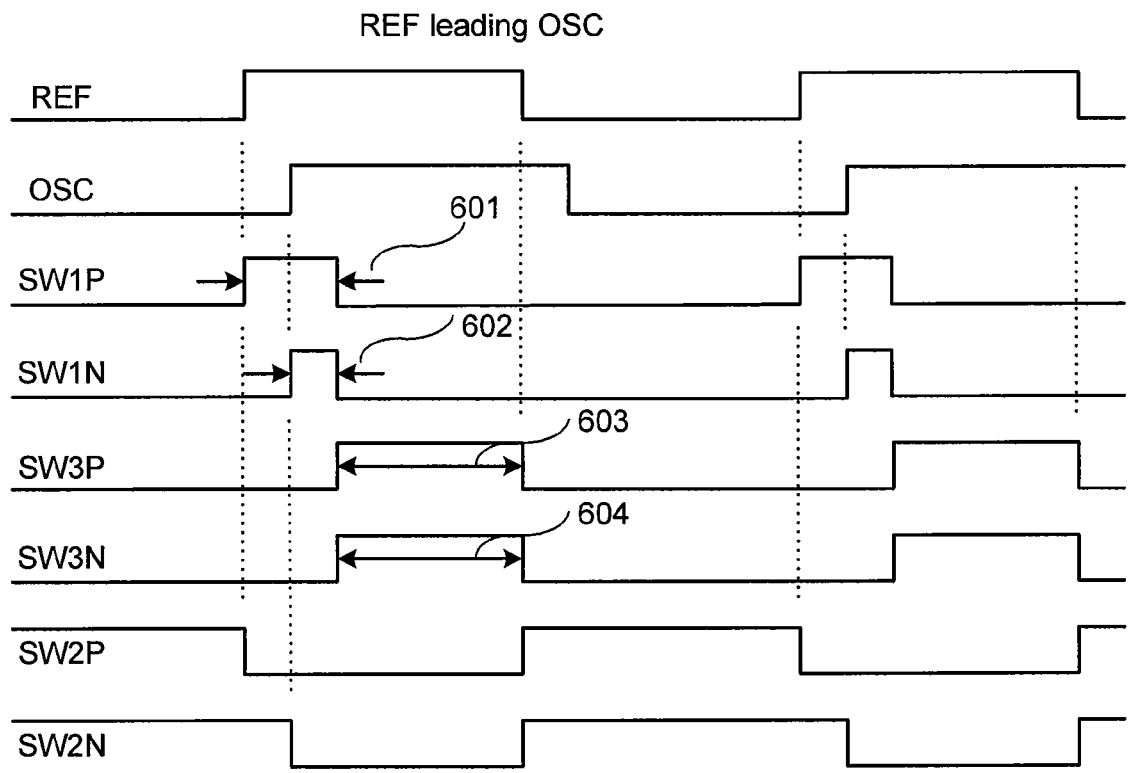
FIG. 6 is a timing diagram as might be present at various nodes of the circuits of FIG. 4 or 8 in the PLL of FIG. 3, where the reference clock leads the oscillator clock.
Figure 7:
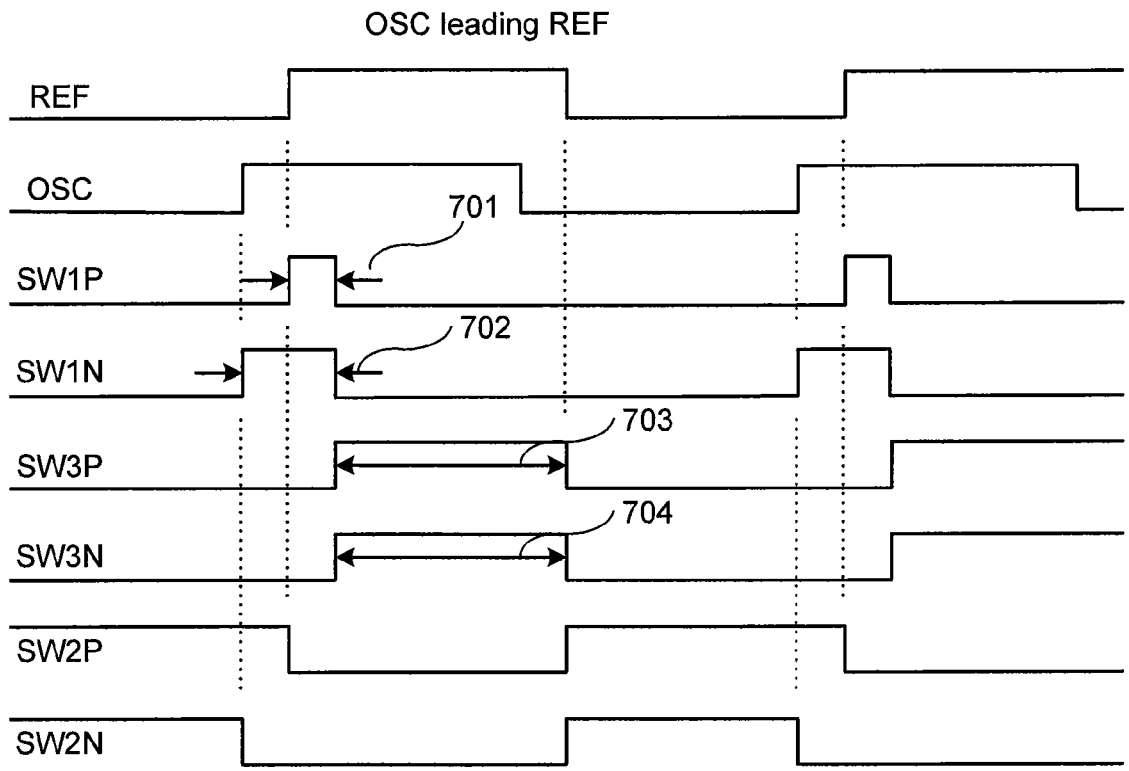
FIG. 7 is a timing diagram as might be present at various nodes of the circuits of FIG. 4 or 8 in the PLL of FIG. 3, where the reference clock lags the oscillator clock.

FIGS. 5-7 illustrate the expected operation of the phase detector. The signals shown in FIGS. 5-7 are relatively simple to generate using a common digital phase-frequency detector and some very simple logic. The operation of the illustrated charge pump assumes that the VCO used in the PLL has a positive gain and its frequency increases with increased control voltage. The operation of the charge pump may be further understood by examining the waveform drawings shown in FIGS. 5-7.

FIG. 5 illustrates a particular embodiment of the present invention where the reference clock and the oscillator inputs of the phase detector are in phase. According to the particular embodiment, the positive edges are used and in phase (i.e., the positive edges are coincident).

According to the embodiment being discussed, signals SW1P and SW1N (the primary phase detector outputs that represent the phase difference), have the minimum and equal pulse widths 501 and 502. One feature of signals SW1P and SW1N is that their negative edges are coincident in time, regardless of their phase difference. The other waveforms are derivatives of these SW1P and SW1N.

Signals SW3P and SW3N start with positive edges that are coincident with the negative edges of signals SW1P and SW1N and have equal and substantially constant durations 503 and 504 for any phase difference. The negative edges of the signals SW3P and SW3N can be driven by events synchronous with the reference clock or the oscillator signal. In the example being discussed, SW3P and SW3N are driven by the negative edge of the reference clock.

Signals SW2P and SW2N are generated as time gap fillers for the other signals. Signal SW2P is active when both SW1P and SW3P are inactive. Signal SW2N is active when both SW1N and SW3N are inactive. As a result, there is at least one switch of switches 407(1)-(3) closed at any given time and at least one switch of switches 408(1)-(3) closed at any given time.

FIG. 6 illustrates the situation where the reference clock leads the oscillator signal. In this situation, SW1N retains the minimum pulse width 602 equal to 502 and the signal SW1P increases its pulse width 601 by the phase difference. The other signals behave similarly and durations 603 and 604 are equal. Note that, again, there is at least one switch of switches 407(1)-(3) closed at any given time and at least one switch of switches 408(1)-(3) closed at any given time.

FIG. 7 illustrates the situation where the oscillator signal leads the reference clock. In this situation the signal SW1P retains the minimum pulse width 701 equal to 501 and the signal SW1N increases its pulse width 702 by the phase difference. The other signals behave similarly and durations 703 and 704 are equal. Note that, again, there is at least one switch of switches 407(1)-(3) closed at any given time and at least one switch of switches 408(1)-(3) closed at any given time.

In the example of the circuit of FIG. 4 operating with input signals provided according to the timing of FIGS. 5-7, several characteristics are present. Ideally, in normal operation (PLL locked), each of the six switch signals have a pulse (i.e., the switches are opening and closing), and the time interval between two consecutive transitions of the same signal is substantially large to allow all the transitory effects in the switches and current sources to settle. Also, the difference of the pulse widths of signals SW1P and SW1N are substantially linear functions of the phase difference between the reference clock and the oscillator signal.

Having described the operation of the switches, the charge pump operation is described next. During the time SW1P is asserted, current source 401 provides positive current 403 and that injects a positive charge into the filter capacitors. Conversely, during the time SW1N is asserted, current source 402 provides negative current 404 and that injects a negative charge into the filter capacitors. The difference in these injected charges is proportional to the phase difference, assuming that the two currents have the same absolute value. The parasitic charge injection due to the switching should be independent of the phase difference due to the conditions described above for the switching signals and it can cause at most a small phase offset in the PLL but not a nonlinearity.

The time slots associated with signals SW3P and SW3N are used for measuring whether the currents match. During this time, the positive and negative currents inject opposite charges into capacitor 419. Any current mismatch will generate an increase or decrease of the voltage Vcf resulting in an automatic correction of the current mismatch due to the action of the operational amplifier 414. The positive current 403 does not change from time SW1P to SW3P, as the voltage Vc is substantially the same as the voltage Vcf. The same is true for the negative current 404. The present described charge pump embodiment also provides a stable voltage on the outputs of the current sources during switching transients, thus minimizing the parasitic charge injection.

Thus, in some embodiments of the present invention, a charge pump configured for use in a phase-locked loop (PLL) includes a positive current source, a negative current source, a plurality of transistor switches, a set of three voltage nodes and a plurality of operational amplifiers, wherein i) the positive and negative current sources each includes an output node, ii) the output nodes are respectively connected sequentially to the three voltage nodes having substantially the same voltage, iii) the transistor switches are configured to sequentially switch such that at all times there is one transistor switch connection, and iv) the currents flows through the transistor switches into one of the three nodes.

The PLL includes a phase detector configured to generate phase error pulses, and a phase-locked loop (PLL) filter. One of the three voltage nodes is connected to the PLL filter and the transistor switches are connected to the PLL filter and are controlled by the phase error pulses. The second node is configured to generate a feedback voltage, which in combination with at least one of the operational amplifiers is configured to control matching of the positive and negative currents. The positive and negative currents are supplied to the second node substantially simultaneously for the same amount of time. The third node is configured to absorb the positive and negative current during a time that the positive and negative currents are not supplied to the other first and second nodes, and the third node is configured to present the same voltage to the output nodes of the current sources. The positive and negative currents are substantially matched. A substantially constant voltage is placed on the outputs of the current sources in order to minimize potential charge injection during switching of the transistor switches. The charge pump is configured to provide for low supply voltage operation and a fast power up of the charge pump.

In other embodiments, there might be only two voltage nodes, one for charge injection and one for feedback.

In some embodiments of the present invention, a phase-locked loop is provided that includes such a charge pump as described above.

Figure 8:
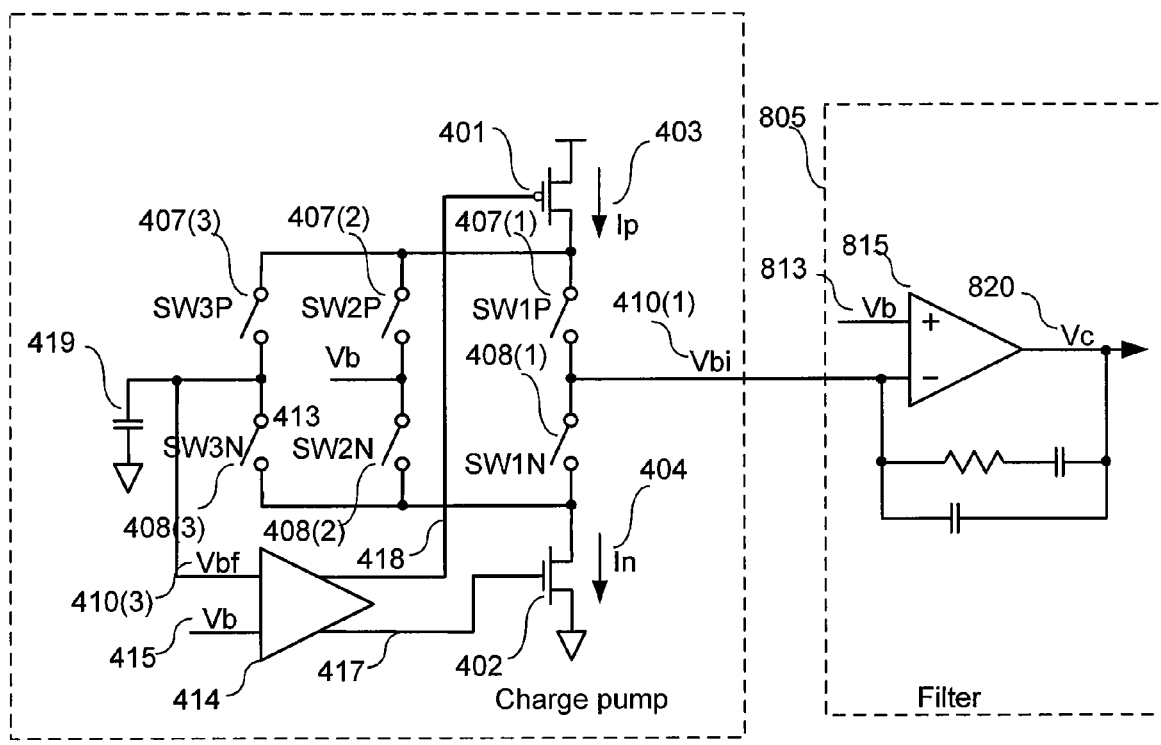
FIG. 8 is a schematic diagram of a novel charge pump according to embodiments of the present invention, followed by an active filter.

FIG. 8 is a simplified schematic diagram of a second embodiment of a charge pump according to another embodiment of the present invention. The operation of the charge pump of FIG. 8 is substantially similar to the charge pump of FIG. 4 with the exception that the voltage on the output of the current sources is constant due to the introduction of an active filter 805, where the passive components of the filter are in the feedback path of an operational amplifier 815. Thus, the output voltage Vbi of the node 806 is substantially equal to the bias voltage Vb of the node 813.

According to the presently described embodiment, the VCO control voltage Vc is present on the node 820.

The approaches described herein are preferred over, for example, those known in the art, such as those shown in U.S. Pat. No. 6,181,210. In that patent, a charge pump is described that has only two switches connected to each current source. The problem with this topology is that the periods of time when the positive current and negative current are connected to the current control feedback node are phase difference dependent.

In a delta-sigma driven synthesizer, the phase difference can have substantial fluctuations, which would have to be averaged with quite a large time constant in the current control feedback loop. This would prevent achieving a fast power up of the charge pump. In contrast, the present invention does not require a slow current control feedback loop and allows for a much shorter power up time.

The ratio N may be varied in time in a random or pseudo-random sequence, with the result that the ratio of the VCO frequency to the reference clock frequency can be a non-integer number, but is the time average of N. Changing the counter ratio N produces a random or pseudorandom sequence to be output from the digital phase detector and from the charge pump's analog output.

According to one embodiment of the present invention, the delta-sigma modulator is configured to generate a random sequence of numbers which has a defined spectrum. The spectral density is relatively low at low frequency and increases at high frequencies such that most of the power is placed outside the PLL bandwidth. The filter, which is a low pass filter, is configured to attenuate the high frequencies produced in the output of the charge pump as a result of the delta-sigma modulator action and thus the control voltage of the VCO and will have relatively low noise.

As explained and described above, novel circuits and methods of use have been described.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A charge pump configured for use in a phase-locked loop (PLL), the charge pump comprising:
   a positive current source;
   a negative current source;
   a plurality of transistor switches;
   a set of three voltage nodes;
   and a plurality of operational amplifiers, wherein:
   a) the positive and negative current sources each includes an output node;
   b) the output nodes are respectively connected sequentially to the three voltage nodes having substantially the same voltage;
   c) the transistor switches are configured to sequentially switch such that at all times there is one transistor switch connection; and
   d) positive and negative currents from the positive and negative current sources, respectively, flow through the transistor switches into one of the three nodes;
   wherein the PLL includes:
   a) a phase detector configured to generate phase error pulses; and
   b) a phase-locked loop (PLL) filter;
   and wherein:
   a) one of the three voltage nodes is connected to the PLL filter and the transistor switches are connected to the PLL filter and are controlled by the phase error pulses,
   b) the second node is configured to generate a feedback voltage, which in combination with at least one of the operational amplifiers is configured to control matching of the positive and negative currents, and
   c) the positive and negative currents are supplied to the second node substantially simultaneously for the same amount of time.

2. The charge pump of claim 1, wherein the third node is configured to absorb the positive and negative current during a time that the positive and negative currents are not supplied to the other first and second nodes, and the third node is configured to present the same voltage to the output nodes of the current sources.

3. The charge pump of claim 2, wherein the positive and negative currents are substantially matched.

4. The charge pump of claim 3, wherein the charge pump is configured to provide for low supply voltage operation and a fast power up of the charge pump.

5. The charge pump of claim 2, wherein a substantially constant voltage is placed on the outputs of the current sources in order to minimize potential charge injection during switching of the transistor switches.

6. A charge pump of a phase-locked loop comprising:
   a positive current source;
   a negative current source;
   a plurality of transistor switches;
   a set of three voltage nodes; and
   a plurality of operational amplifiers, wherein:
   a) the positive and negative current sources each includes an output node, and the output nodes are respectively connected sequentially to the three voltage nodes having substantially the same voltage, b) the transistor switches are configured to sequentially switch such that at all times there is one transistor switch connection, and c) positive and negative currents from the positive and negative current sources, respectively, flow through the transistor switches into one of the three nodes;

a phase detector configured to generate phase error pulses; and a phase-locked loop (PLL) filter, wherein:

a) one of the three voltage nodes is connected to the PLL filter and the transistor switches are connected to the PLL filter and are controlled by the phase error pulses;

b) the second node is configured to generate a feedback voltage which in conjunction with at least one of the operational amplifiers is configured to control matching of the positive and negative currents, and c) the positive and negative currents are connected to the second node substantially simultaneously for the same amount of time.

7. The charge pump of claim 6, wherein the third node is configured to absorb the positive and negative current during a time that the positive and negative currents are not supplied to the other first and second nodes, and the third node is configured to present the same voltage to the output nodes of the current sources.

8. The charge pump of claim 7, wherein the positive and negative currents are substantially matched.

9. The charge pump of claim 7, wherein a substantially constant voltage is placed on the outputs of the current sources in order to minimize potential charge injection during switching of the transistor switches.

10. The charge pump of claim 9, wherein the charge pump is configured to provide for low supply voltage operation and a fast power up of the charge pump.

11. A charge pump configured for use in a phase-locked loop (PLL), the charge pump comprising:

a positive current source;

a positive input node for receiving a positive control signal that controls the positive current source;

a negative current source;

a negative input node for receiving a negative control signal that controls the negative current source;

an output node of the charge pump, coupled to the positive current source and the negative current source to output a net positive or negative current based, at least in part, on the relative timing of the positive control signal and the negative control signal;

an operational amplifier having at least one input and at least two outputs, wherein one of the at least two outputs is used to control an on current level for the positive current source and another one of the at least two outputs is used to control an on current level for the negative current source and an input of the at least one input coupled to a node that provides an indication of a current imbalance, if any, between the positive current source and the negative current source;

a charge collector circuit coupled to a feedback node that collects positive current from the positive current source when a positive feedback signal is enabled and the positive control signal is not enabled and that collects negative current from the negative current source when a negative feedback signal is enabled and the negative control signal is not enabled.

12. The charge pump of claim 11, wherein the positive feedback signal and the negative feedback signal are enabled substantially simultaneously for the same amount of time.

13. The charge pump of claim 11, further comprising a third set of switches that draw current from the positive current source or provide current to the negative current source when the operational amplifier is not activated and the positive control signal is not enabled and the negative control signal is not enabled.

14. The charge pump of claim 11, wherein the charge collector circuit is a capacitor coupled between the feedback node and ground.

\* \* \* \* \*